United States Patent
Jung

(10) Patent No.: US 9,006,724 B2
(45) Date of Patent: Apr. 14, 2015

(54) ORGANIC LIGHT EMITTING DIODE DISPLAY

(71) Applicant: Samsung Display Co., Ltd., Yongin, Gyeonggi-Do (KR)

(72) Inventor: Young-Bae Jung, Yongin (KR)

(73) Assignee: Samsung Display Co., Ltd., Yongin, Gyunggi-Do (KR)

( * ) Notice: Subject to any disclaimer, the term of this patent is extended or adjusted under 35 U.S.C. 154(b) by 0 days.

(21) Appl. No.: 14/060,684

(22) Filed: Oct. 23, 2013

(65) Prior Publication Data

US 2014/0374703 A1  Dec. 25, 2014

(30) Foreign Application Priority Data

Jun. 21, 2013 (KR) .................. 10-2013-0071850

(51) Int. Cl.
- *H01L 29/08* (2006.01)
- *H01L 35/24* (2006.01)
- *H01L 51/00* (2006.01)
- *H01L 27/32* (2006.01)

(52) U.S. Cl.
CPC ................................ *H01L 27/3248* (2013.01)

(58) Field of Classification Search
USPC ............................................ 257/40, E51.018
See application file for complete search history.

(56) References Cited

U.S. PATENT DOCUMENTS

| | | | | |
|---|---|---|---|---|
| 6,738,030 | B2 * | 5/2004 | Kim et al. | 345/45 |
| 6,937,314 | B2 * | 8/2005 | Kim | 349/149 |
| 8,391,020 | B2 * | 3/2013 | Saimen | 361/803 |
| 8,715,014 | B2 * | 5/2014 | Yeon | 439/680 |
| 2007/0024794 | A1 * | 2/2007 | Kim | 349/152 |
| 2009/0268147 | A1 * | 10/2009 | Tang et al. | 349/151 |
| 2010/0294535 | A1 * | 11/2010 | Koezuka et al. | 174/126.1 |
| 2012/0127384 | A1 * | 5/2012 | Miyake et al. | 349/15 |
| 2013/0181966 | A1 * | 7/2013 | Jeong et al. | 345/211 |
| 2013/0194550 | A1 * | 8/2013 | Tanigawa et al. | 353/30 |
| 2013/0271958 | A1 * | 10/2013 | Jang et al. | 362/97.1 |
| 2013/0286054 | A1 * | 10/2013 | Kitadani et al. | 345/690 |
| 2013/0313412 | A1 * | 11/2013 | Kurokawa et al. | 250/208.2 |
| 2014/0159097 | A1 * | 6/2014 | Yamazaki et al. | 257/98 |

FOREIGN PATENT DOCUMENTS

| | | |
|---|---|---|
| KR | 10-0244184 B1 | 2/2000 |
| KR | 10 2002-0094636 A | 12/2002 |
| KR | 10 2004-0061951 A | 7/2004 |

* cited by examiner

*Primary Examiner* — Ida M Soward
(74) *Attorney, Agent, or Firm* — Lee & Morse, P.C.

(57) ABSTRACT

An organic light emitting diode (OLED) display includes a pixel part on a substrate, the pixel part being configured to display an image, a peripheral part at a peripheral area of the pixel part, the peripheral part including a chip on film connection part, and a chip on film connected to the chip on film connection part, the chip on film connection part including a chip on film bonding part, the chip on film being attached to the chip on film bonding part, and an array test part separated from the chip on film bonding part, the array test part being contacted with a probe pin.

13 Claims, 9 Drawing Sheets

ORGANIC LIGHT EMITTING DIODE DISPLAY

CROSS-REFERENCE TO RELATED APPLICATION

Korean Patent Application No. 10-2013-0071850, filed on Jun. 21, 2013, in the Korean Intellectual Property Office, and entitled: "Organic Light Emitting Diode Display," is incorporated by reference herein in its entirety.

BACKGROUND

1. Field

The present disclosure relates to an organic light emitting diode (OLED) display.

2. Description of the Related Art

An organic light emitting diode (OLED) display includes two electrodes and an organic emission layer disposed between the two electrodes. Electrons injected from one electrode and holes injected from the other electrode are combined in the organic emission layer to form excitons, and light is emitted by energy generated from the excitons.

In a manufacturing process of the organic light emitting diode (OLED) display, a test process is performed after each process to prevent a defective product from moving to a following process. In the test process, a probe pin directly contacts an array test pad, i.e., an end of a signal line, in an array test, a test signal is applied, and then a charge amount stored in each pixel is detected to analyze a disconnection, a short, and/or a pixel defect. The array test pad may also be used as a chip on film (COF) bonding pad to attach a COF to an end of the signal line.

SUMMARY

Embodiments provide an organic light emitting diode (OLED) display preventing damage to a chip on film bonding pad and a contact defect of a probe pin on an array test.

An organic light emitting diode (OLED) display according to an exemplary embodiment includes a pixel part on a substrate, the pixel part being configured to display an image, a peripheral part at a peripheral area of the pixel part, the peripheral part including a chip on film connection part, and a chip on film connected to the chip on film connection part, the chip on film connection part including a chip on film bonding part, the chip on film being attached to the chip on film bonding part, and an array test part separated from the chip on film bonding part, the array test part being contacted with a probe pin.

The chip on film bonding part may include a gate insulating layer formed on the substrate, a chip on film bonding scan line formed on the gate insulating layer, an interlayer insulating layer covering the chip on film bonding gate wire, and a chip on film bonding pad formed on the interlayer insulating layer and connected to the chip on film bonding scan line through a contact hole formed in the interlayer insulating layer.

A protective layer covering the chip on film bonding pad and having a chip on film bonding opening exposing a portion of the chip on film bonding pad may be further included.

The array test part may include an array test pad formed on the interlayer insulating layer and connected to the chip on film bonding pad.

The protective layer may have an array test opening exposing a portion of the array test pad.

A shorting bar connection line formed on the gate insulating layer and connected to the array test pad through a contact hole formed in the interlayer insulating layer may be further included.

The shorting bar connection line may overlap the array test pad.

The chip on film bonding part may further include a shorting bar connection pad extending from the chip on film bonding pad.

The array test pad and the shorting bar connection pad may extend to be branched into two from the chip on film bonding pad.

A shorting bar connection line formed on the gate insulating layer and connected to the shorting bar connection pad through the contact hole formed in the interlayer insulating layer may be further included.

The shorting bar connection line may overlap the shorting bar connection pad.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Figure 1:
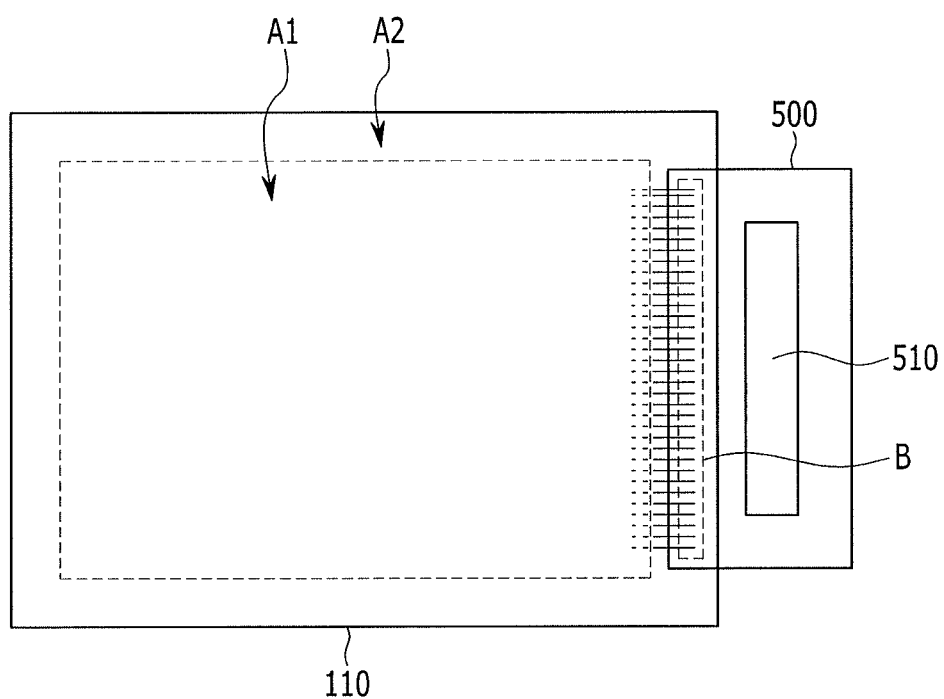
FIG. 1 illustrates a schematic top plan view of an organic light emitting diode (OLED) display according to the first exemplary embodiment.

Example embodiments will be described more fully hereinafter with reference to the accompanying drawings. As those skilled in the art would realize, the described embodiments may be modified in various different ways, all without departing from the spirit or scope sets forth herein.

The drawings and description are to be regarded as illustrative in nature and not restrictive. In addition, the size and thickness of each component shown in the drawings are shown for ease of understanding and description, but embodiments are not limited thereto. Further, in the drawings, the thickness of layers, films, panels, regions, etc., may be exaggerated for clarity.

It will be understood that when an element, such as a layer, film, region, or substrate, is referred to as being "on" another element, it can be directly on the other element or intervening elements may also be present. Like reference numerals designate like elements throughout the specification.

In addition, in the accompanying drawings, a 2Tr 1Cap structured active matrix (AM) type of an organic light emitting diode (OLED) display, in which a pixel includes two thin film transistors (TFT) and one capacitor, is illustrated. However, embodiments are not limited thereto. Therefore, an OLED display according to embodiments may have various structures, e.g., a pixel may include a plurality of TFTs and at least one capacitor, a wiring line may be further formed, and a conventional wiring line may be omitted. Here, a pixel refers to a minimum unit that displays an image, and an OLED display displays an image through a plurality of pixels.

An OLED display according to a first exemplary embodiment will now be described in detail with reference to FIG. 1 to FIG. 6.

FIG. 1 illustrates a top plan view of an organic light emitting diode (OLED) display according to the first exemplary embodiment.

As shown in FIG. 1, an organic light emitting diode (OLED) display according to the first exemplary embodiment may include a substrate 110, a pixel part A1 formed on the substrate 110 and displaying an image, and a peripheral part A2 formed at a peripheral area of the pixel part A1. In the peripheral part A2, a chip on film 500 mounted with a driving circuit chip 510 may be connected to a chip on film connection part B, as will be described in detail with reference to FIGS. 5-6.

Next, referring to FIG. 2 to FIG. 4, the pixel part A1 of the organic light emitting diode (OLED) display according to the first exemplary embodiment will be described, and referring to FIG. 5 and FIG. 6, the chip on film connection part B of the organic light emitting diode (OLED) display according to the first exemplary embodiment will be described.

Figure 2:
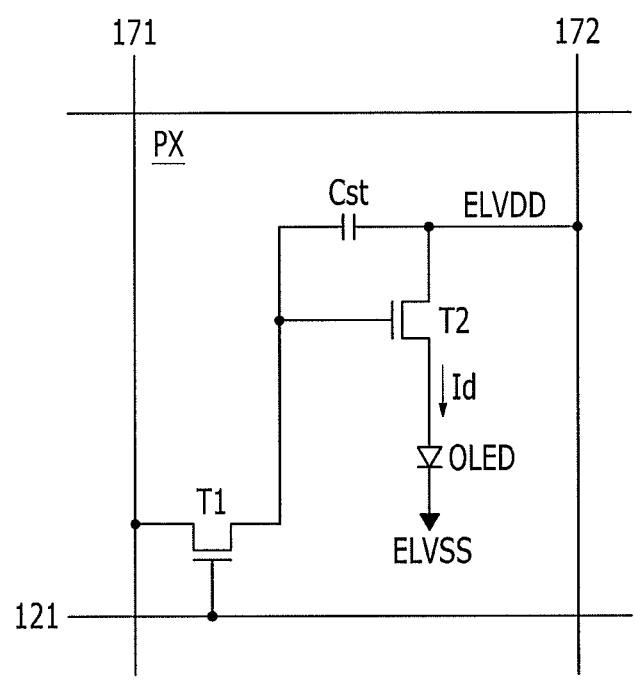
FIG. 2 illustrates an equivalent circuit of an organic light emitting diode (OLED) display according to the first exemplary embodiment.
Figure 3:
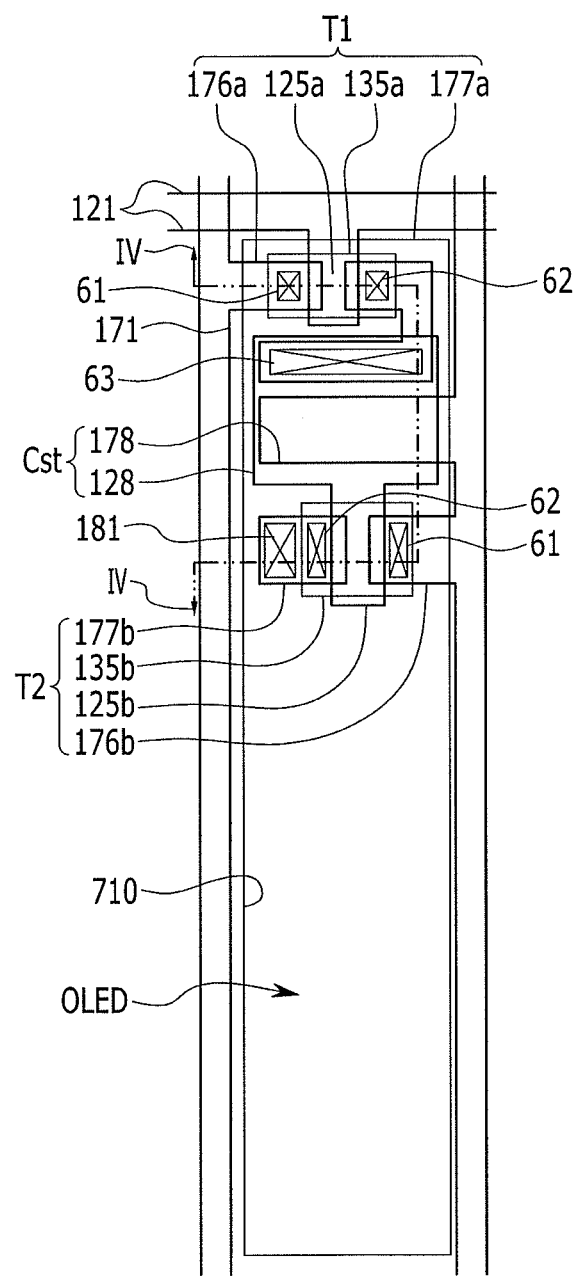
FIG. 3 illustrates a layout view of a pixel of a pixel part of an organic light emitting diode (OLED) display according to the first exemplary embodiment.
Figure 4:
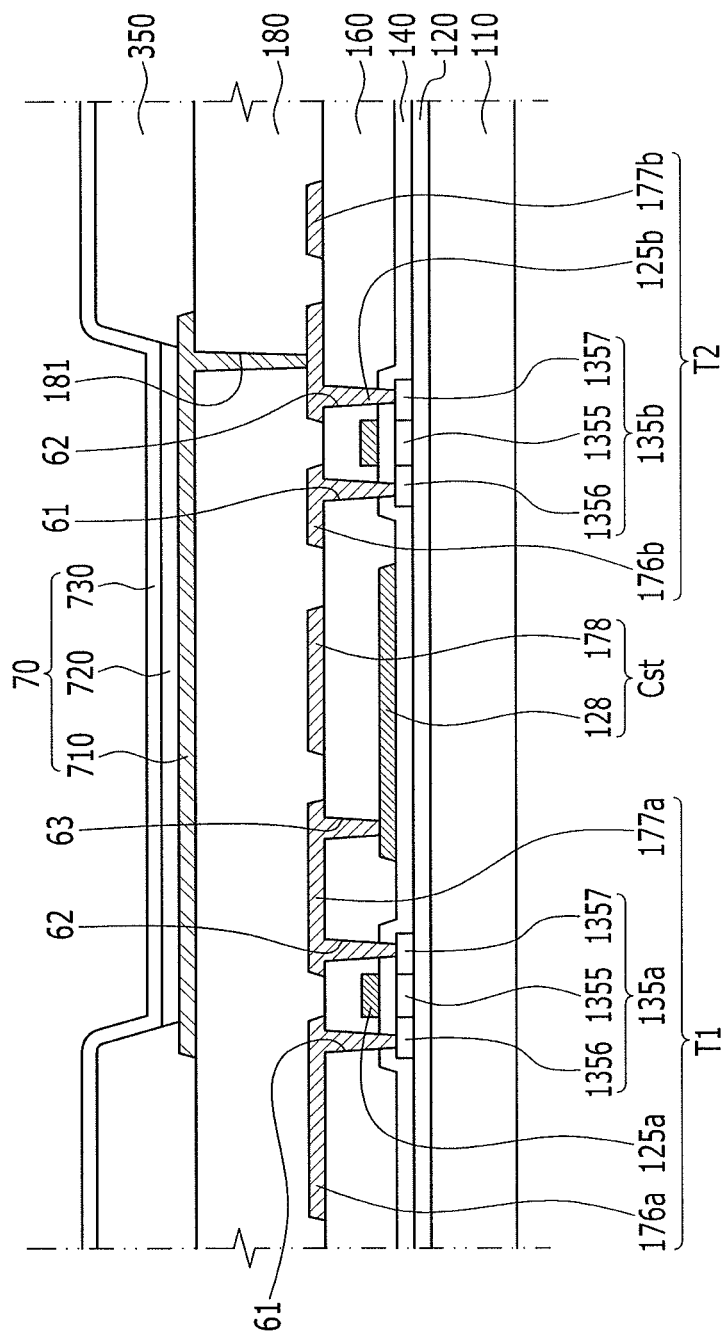
FIG. 4 illustrates a cross-sectional view taken along line IV-IV of FIG. 3.

FIG. 2 illustrates an equivalent circuit of an organic light emitting diode (OLED) display according to the first exemplary embodiment, FIG. 3 illustrates a layout view of a pixel of the pixel part A1 of the organic light emitting diode (OLED) display according to the first exemplary embodiment, and FIG. 4 illustrates a cross-sectional view taken along line IV-IV of FIG. 3.

Referring to FIGS. 1-2, the pixel part A1 of the organic light emitting device according to the first exemplary embodiment may include a plurality of signal lines 121, 171, and 172, and a plurality of pixels PX connected to the signal lines and arranged substantially in a matrix. The signal lines may include a plurality of scan lines 121 for transmitting scan signals (or gate signals), a plurality of data lines 171 for transmitting data signals, and a plurality of driving voltage lines 172 for transmitting a driving voltage ELVDD. The scan lines 121 are parallel with each other in a row direction, and the data lines 171 and the driving voltage lines 172 are parallel with each other in a column direction. Each of the pixels PX may include a switching thin film transistor T1, a driving thin film transistor T2, a storage capacitor Cst, and an organic light emitting diode (OLED).

As illustrated in FIG. 2, the switching thin film transistor T1 has a control terminal, an input terminal, and an output terminal. The control terminal is connected to the scan line 121, the input terminal is connected to the data line 171, and the output terminal is connected to the driving thin film transistor T2. The switching thin film transistor T1 transmits a data signal from the data line 171 to the driving thin film transistor T2 in response to a scan signal from the scan lines 121.

The driving thin film transistor T2 also has a control terminal, an input terminal, and an output terminal. The control terminal is connected to the switching thin film transistor T1, the input terminal is connected to the driving voltage line 172, and the output terminal is connected to the organic light emitting diode OLED. The driving thin film transistor T2 causes an output current Id, which varies in amplitude in accordance with a voltage applied between the control terminal and the output terminal, to flow.

The storage capacitor Cst is connected between the control terminal and input terminal of the driving thin film transistor T2. The storage capacitor Cst charges a data signal applied to the control terminal of the driving thin film transistor T2, and maintains the data signal after the switching thin film transistor T1 is turned off.

The organic light emitting diode OLED has an anode connected to the output terminal of the driving thin film transistor T2 and a cathode connected to a common voltage ELVSS. The organic light emitting diode OLED displays an image by emitting light with different intensity according to an output current Id of the driving thin film transistor T2.

The switching thin film transistor T1 and the driving thin film transistor T2 may be n-channel field effect transistors (FETs) or p-channel FETs. The connection relationship among the thin film transistors T1 and T2, the storage capacitor Cst, and the organic light emitting diode OLED may vary.

A detailed structure of the pixel of the organic light emitting diode display of FIG. 2 will now be described in further detail with reference to FIG. 3 and FIG. 4 as well as FIG. 2.

As shown in FIGS. 3 and 4, the organic light emitting display (OLED) according to the exemplary embodiment may include a buffer layer 120 formed on the substrate 110. The substrate 110 may be an insulating substrate, e.g., made of glass, quartz, ceramic, plastic, etc., or a metal substrate, e.g., made of a stainless steel, etc. For example, the buffer layer 120 may have a single-layer structure of silicon nitride ($SiN_x$), or a dual-layer structure of silicon nitride ($SiN_x$) and silicon oxide ($SiO_2$) laminated to each other. The buffer layer 120 prevents penetration of elements, e.g., impurities or moisture, and helps planarize the surface of the substrate 110.

A switching semiconductor layer 135a and a driving semiconductor layer 135b may be formed on the buffer layer 120, and may be spaced apart from each other. The switching and driving semiconductor layers 135a and 135b may be made of, e.g., a polysilicon or an oxide semiconductor. Each of the switching and driving semiconductor layers 135a and 135b may include a channel region where an impurity is not doped, and a source region and a drain region that are positioned at both sides of the channel region and doped with the impurity. The impurity may be changed according to a kind of the thin film transistor, and may be an N-type impurity or a P-type impurity.

The switching semiconductor layer 135a and the driving semiconductor layer 135b are respectively divided into a channel region 1355 and a source region 1356 and drain region 1357 formed at respective sides of the channel region 1355. The channel region 1355 of the switching semiconductor layer 135a and the driving semiconductor layer 135b may include polysilicon without impurities, i.e., an intrinsic semiconductor, and the source region 1356 and the drain region 1357 of the switching semiconductor layer 135a and the driving semiconductor layer 135b may include a polysilicon doped with a conductive impurity, i.e., an impurity semiconductor.

A gate insulating layer 140 may be formed on the switching semiconductor layer 135a and the driving semiconductor layer 135b. The gate insulating layer 140 may be a single layer or a multi-layer, e.g., including at least one of silicon nitride and silicon oxide.

The scan line 121, a driving gate electrode 125b, and a first storage capacitive plate 128 may be formed on the gate insulating layer 140. The scan line 121 may longitudinally extend in a horizontal direction and transfer a scan signal, and may include a switching gate electrode 125a protruding from the scan line 121 toward the switching semiconductor layer 135a. The driving gate electrode 125b may protrude from the first storage capacitor plate 128 toward the driving semiconductor layer 135b. The switching gate electrode 125a and the driving gate electrode 125b respectively overlap the channel regions 1355.

An interlayer insulating layer 160 may be formed on the scan line 121, the driving gate electrode 125b, and the first storage capacitor plate 128. The interlayer insulating layer 160 may be formed of e.g., silicon nitride or silicon oxide like the gate insulating layer 140.

Source contact holes 61 and drain contact holes 62 may be formed in the interlayer insulating film 160 and the gate insulating film 140 to expose the source regions 1356 and the drain regions 1357, respectively. Storage contact holes 63 may be formed in the interlayer insulating film 160 to expose part of the first storage capacitor 128.

A data line 171 having a switching source electrode 176a, a driving voltage line 172 having a driving source electrode 176b and a second storage capacitor plate 178, a switching drain electrode 177a connected to the first storage capacitor plate 128, and a driving drain electrode 177b may be formed on the interlayer insulating layer 160.

The data line 171 transmits a data signal and extends in a direction crossing the gate line 121. The driving voltage line 172 transfers a driving voltage, and is separated from the data line 171 and extends in the same direction as the data line 171.

The switching source electrode 176a may protrude from the data line 171 toward the switching semiconductor layer 135a, and the driving source electrode 176b may protrude from the driving voltage line 172 toward the driving semiconductor layer 135b. The switching source electrode 176a and the driving source electrode 176b are respectively connected to the source regions 1356 through the source contact holes 61. The switching drain electrode 177a faces the switching source electrode 176a, the driving drain electrode 177b faces the driving source electrode 176b, and the switching drain electrode 177a and the driving drain electrode 177b are respectively connected to the drain regions 1357 through the drain contact holes 62.

The switching drain electrode 177a may be extended and electrically connected to the first storage capacitor plate 128 and the driving gate electrode 125b through the storage contact holes 63 formed in the interlayer insulating film 160.

The second storage capacitor plate 178 may protrude from the driving voltage line 171 and may overlap the first storage capacitor plate 128. Accordingly, the first storage capacitor plate 128 and the second storage capacitor plate 178 constitute the storage capacitor Cst by using the interlayer insulating film 160 as a dielectric material. The switching semiconductor layer 135a, the switching gate electrode 125a, the switching source electrode 176a, and the switching drain electrode 177a constitute the switching thin film transistor T1. The driving semiconductor layer 135b, the driving gate electrode 125a, the driving source electrode 176b, and the driving drain electrode 177b constitute the driving thin film transistor T2.

A protective film 180 may be formed on the switching source electrode 176a, the driving source electrode 176b, the switching drain electrode 177a, and the driving drain electrode 177b. The protective film 180 may include a pixel protective film 180a positioned under a pixel electrode 710 and a peripheral protective film 180b positioned under the periphery of the pixel electrode 710. The pixel protective film 180a may protrude higher than the peripheral protective film 180b by a protrusion height d.

The pixel electrode 710 may be formed on the pixel protective film 180a of the protective film 180. The pixel electrode 710 is electrically connected to the driving drain electrode 177b of the driving thin film transistor T2 through a contact hole 181 formed in the interlayer insulating film 160, and serves as an anode of the organic light emitting diode.

A pixel defining film 350 may be formed on the protective film 180 and an edge portion of the pixel electrode 710. The pixel defining film 350 has an opening 351 exposing the pixel electrode 710. The pixel defining film 180 may be made of a resin, e.g., a polyacrylate resin or polyimide resin, a silica-based inorganic material, or the like.

An organic emission layer 720 may be formed in the opening 351 of the pixel defining film 350. The organic emission layer 720 may be formed as a plurality of layers including one or more of an emission layer, a hole-injection layer (HIL), a hole-transporting layer (HTL), an electron-transporting layer (ETL), and an electron-injection layer (EIL). If the organic emission layer 720 includes all the above layers, the hole-injection layer may be positioned on the pixel electrode 710 serving as an anode, and the hole-transporting layer, the emission layer, the electron-transporting layer, and the electron-injection layer may be sequentially laminated on the pixel electrode 710.

A common electrode 730 may be formed on the pixel defining film 350 and the organic emission layer 720. The common electrode 730 may be formed of a reflective film or a semi-transmissive film including a reflective material. The reflective material constituting the reflective film or semi-transmissive film may be at least one metal, e.g., Mg, Ag, Au, Ca, Li, Cr, and Al, or alloys thereof. The common electrode 730 serves as a cathode of the organic light emitting diode OLED. The pixel electrode 710, the organic emission layer 720, and the common electrode 730 constitute the organic light emitting diode (OLED) 70.

The chip on film connection part B on the peripheral part of the organic light emitting diode (OLED) display according to the first exemplary embodiment will now be described with reference to FIG. 5 and FIG. 6.

Figure 5:
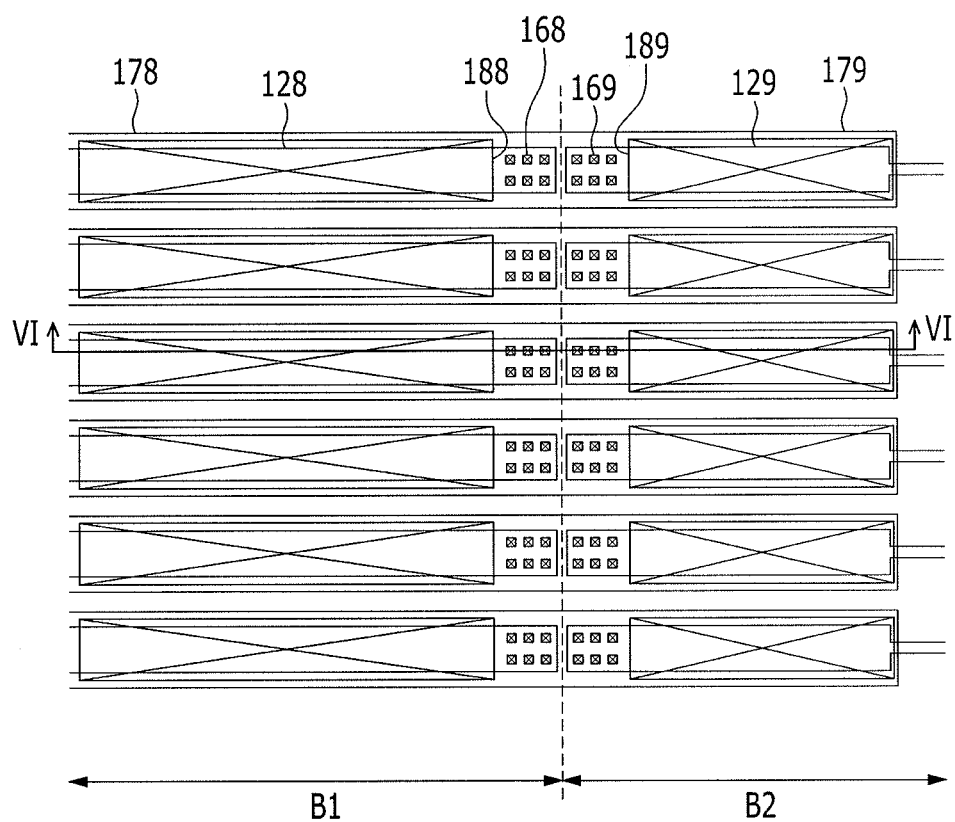
FIG. 5 illustrates a layout view of a chip on film connection part of an organic light emitting diode (OLED) display according to the first exemplary embodiment.
Figure 6:
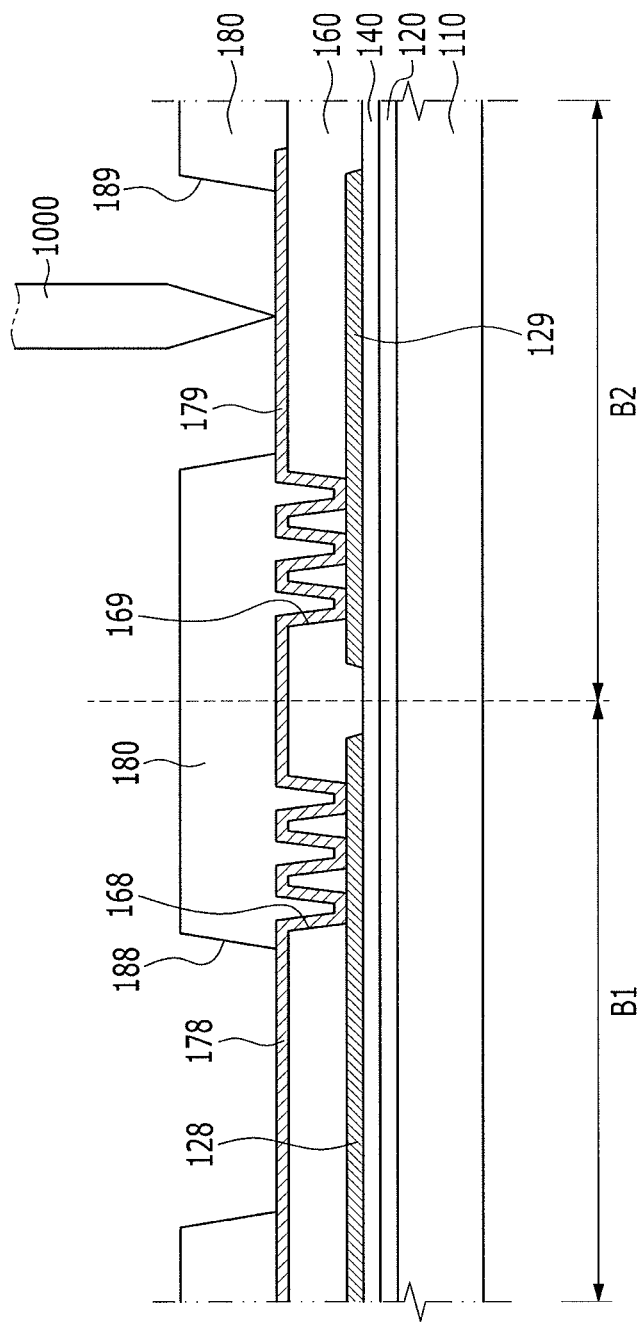
FIG. 6 illustrates a cross-sectional view taken along line VI-VI of FIG. 5.

FIG. 5 illustrates a layout view of the chip on film connection part B of the organic light emitting diode (OLED) display according to the first exemplary embodiment, and FIG. 6 illustrates a cross-sectional view along line VI-VI of FIG. 5.

As shown in FIG. 5 and FIG. 6, the chip on film connection part B may include a chip on film bonding part B1, to which the chip on film 500 is attached, and an array test part B2 separated from the chip on film bonding part B1 and contacted with a probe pin 1000.

The chip on film bonding part B1 may include a chip on film bonding scan line 128, i.e., the first storage capacitive plate 128 of the capacitor, formed on the gate insulating layer 140 and a chip on film bonding pad 178, i.e., the second storage capacitive plate 178, formed on the interlayer insulating layer 160 covering the chip on film bonding scan line 128. The chip on film bonding scan line 128 may be connected to the scan line 121 or the data line 171. The chip on film bonding pad 178 and the chip on film bonding scan line 128 may extend in the same direction, and the chip on film bonding pad 178 may overlap the chip on film bonding scan line 128. The chip on film bonding pad 178 may be connected to the chip on film bonding scan line 128 through a contact hole 168 formed in the interlayer insulating layer 160.

The array test part B2 may include an array test pad 179 formed on the interlayer insulating layer 160 and, e.g., electrically, connected to the chip on film bonding pad 178. The array test pad 179 may extend in the same direction as the elongation direction of the chip on film bonding pad 178.

A shorting bar connection line 129 overlapping the array test pad 179 may be formed on the gate insulating layer 140, and the shorting bar connection line 129 may be connected to the array test pad 179 through a contact hole 169 formed in the interlayer insulating layer 160. The shorting bar connection line 129 may be separated, e.g., spaced apart horizontally, from the chip on film bonding scan line 128. For example, as illustrated in FIG. 6, the shorting bar connection line 129 may be separated from the chip on film bonding scan line 128 by a portion of the interlayer insulating layer 160. The shorting bar connection line 129 may formed in the same layer as, e.g., at a same vertical distance from the substrate 110 as, the chip on film bonding scan line 128, and may extend in the same direction as the elongation direction of the chip on film bonding scan line 128.

As described above, the shorting bar connection line 129 is not directly connected to the chip on film bonding scan line 128, but is rather indirectly connected to the chip on film bonding scan line 128 through the contact holes 168 and 169. Accordingly, as direct contact between the array test pad 179 of the probe pin 1000 and the chip on film bonding scan line 128 is eliminated, a potential damage to the chip on film bonding scan line 128 by secondary corrosion via a damaged array test pad 179 may be prevented or substantially minimized.

The protective layer 180 may be formed on the chip on film bonding pad 178 and the array test pad 179. The protective layer 180 may have a chip on film bonding opening 188 exposing a portion of the chip on film bonding pad 178 and an array test opening 189 exposing a portion of the array test pad 179.

As described above, the chip on film bonding opening 188 exposing the portion of the chip on film bonding pad 178 and the array test opening 189 exposing the portion of the array test pad 179 may be separated from each other, i.e., via a portion of the protective layer 180. As such, the chip on film bonding part B1, to which the chip on film 500 is attached, and the array test part B2, which the probe pin 1000 contacts, may be separated from each other, i.e., via the portion of the protective layer 180.

Accordingly, in the array test, the probe pin 1000 may not, e.g., directly, contact the chip on film bonding part B1, so damage of the chip on film bonding pad 178 may be prevented or substantially minimized. Also, as the contact holes 168 and 169 are covered by the protective layer 180, which separates the chip on film bonding part B1 and the array test part B2, a contact defect of the contact hole having protrusions and depressions may be prevented.

It is noted, with respect to the first exemplary embodiment, that the array test pad overlaps the shorting bar connection line. However, the array test pad may not overlap the shorting bar connection line in a second exemplary embodiment, as will be described with reference to FIG. 7.

Figure 7:
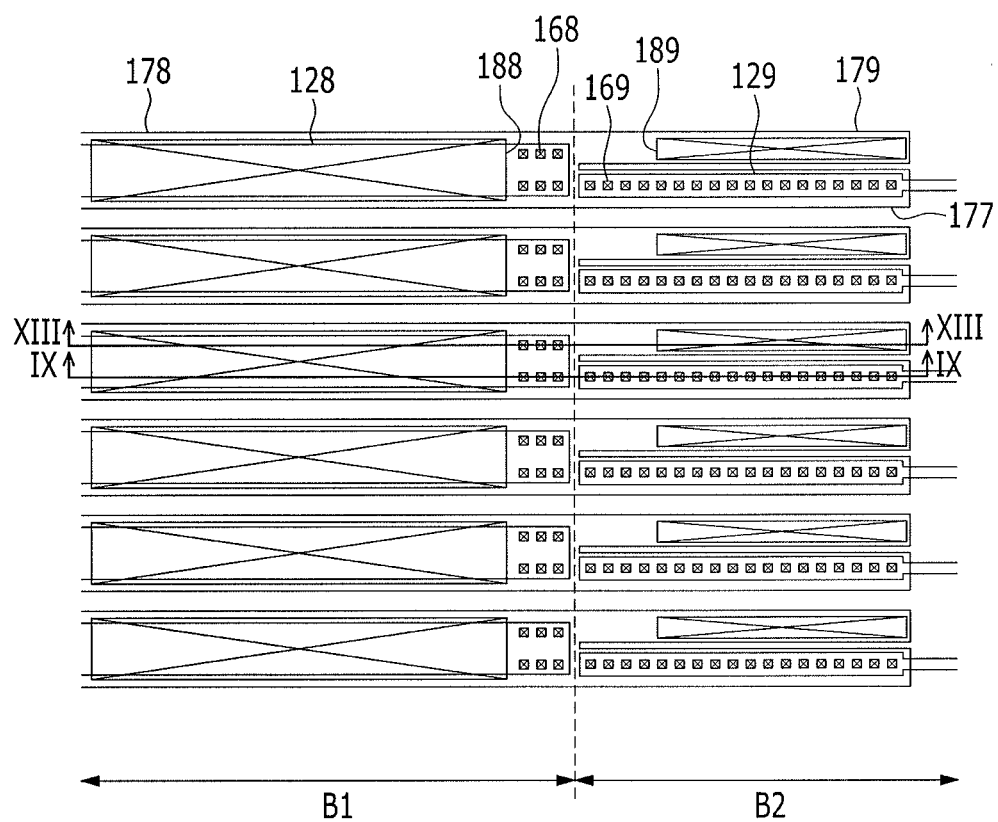
FIG. 7 illustrates a layout view of a chip on film connection part of an organic light emitting diode (OLED) display according to the second exemplary embodiment.
Figure 8:
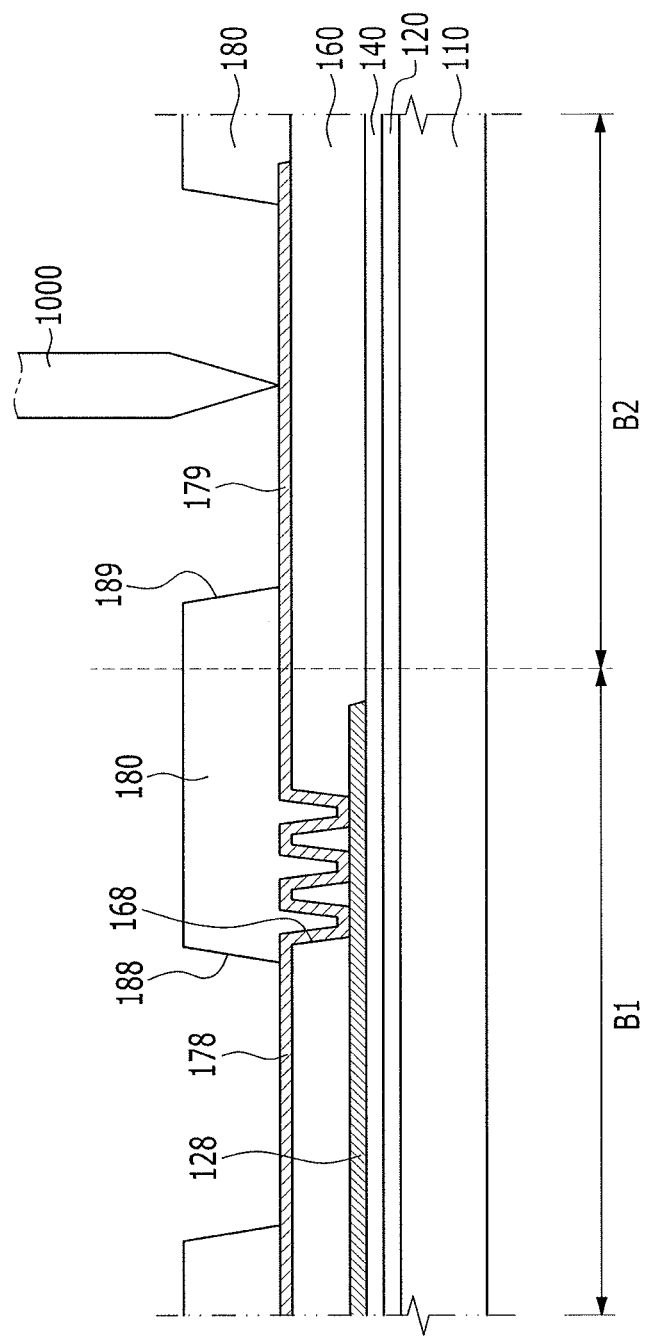
FIG. 8 illustrates a cross-sectional view taken along line VIII-VIII of FIG. 7.
Figure 9:
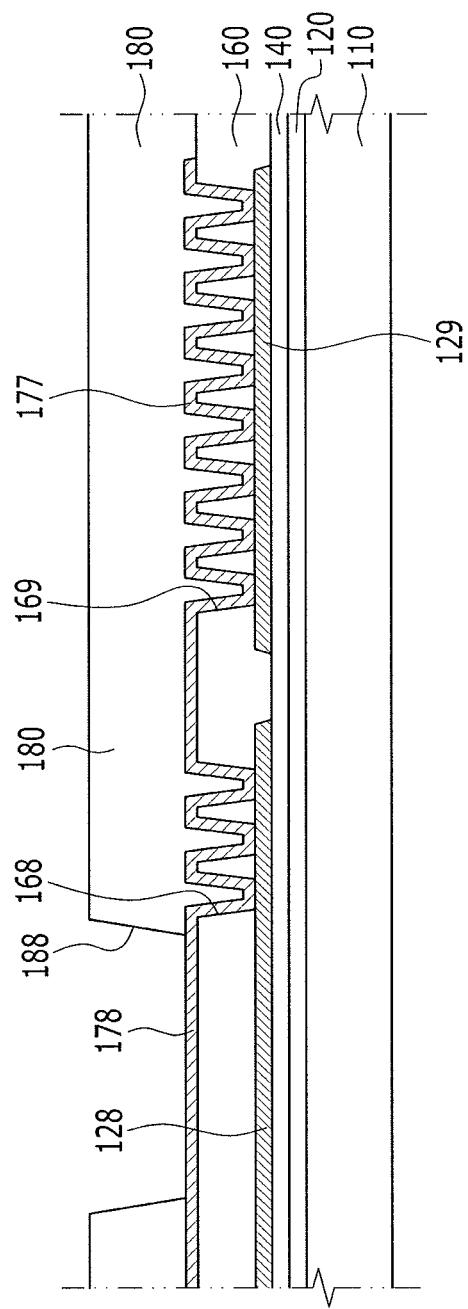
FIG. 9 illustrates a cross-sectional view taken along line IX-IX of FIG. 7.

FIG. 7 illustrates a layout view of a chip on film connection part of an organic light emitting diode (OLED) display according to a second exemplary embodiment, FIG. 8 illustrates a cross-sectional view taken along line VIII-VIII of FIG. 7, and FIG. 9 illustrates a cross-sectional view taken along line IX-IX of FIG. 7.

The second exemplary embodiment shown in FIG. 7 to FIG. 9 is substantially equivalent to the first exemplary embodiment shown in FIG. 5 and FIG. 6, except for a position of the array test pad. Therefore, overlapping description is omitted.

As shown in FIG. 7 to FIG. 9, the chip on film connection part includes a chip on film bonding part B1 to which the chip on film 500 is attached, and an array test part B2 separated from the chip on film bonding part B1 and contacted with the probe pin 1000.

The chip on film bonding part B1 may include the chip on film bonding scan line 128 formed on the gate insulating layer 140, the chip on film bonding pad 178 formed on the interlayer insulating layer 160 covering the chip on film bonding scan line 128, and a shorting bar connection pad 177 extending from the chip on film bonding pad 178. The chip on film bonding pad 178 and the chip on film bonding scan line 128 extend in the same direction, and the chip on film bonding pad 178 overlaps the chip on film bonding scan line 128. The chip on film bonding pad 178 is connected to the chip on film bonding scan line 128 through the contact hole 168 formed in the interlayer insulating layer 160.

The array test part B2 may include an array test pad 179 formed on the interlayer insulating layer 160 and connected to the chip on film bonding pad 178. The array test pad 179 and the shorting bar connection pad 177 may be branched in two, e.g., as two parallel lines shown in the array test part B2 in FIG. 7, thereby extending in the same direction as the elongation direction of the chip on film bonding pad 178.

The shorting bar connection line 129 overlapping the shorting bar connection pad 177 may be formed on the gate insulating layer 140, and the shorting bar connection line 129 may be connected to the shorting bar connection pad 179 through the contact hole 169 formed in the interlayer insulating layer 160. The shorting bar connection line 129 may be separated from the chip on film bonding scan line 128 formed with the same layer as the shorting bar connection line 129 and overlaps the shorting bar connection pad 177.

The protective layer 180 may be formed on the chip on film bonding pad 178, the shorting bar connection pad 177, and the array test pad 179. The protective layer 180 may have the chip on film bonding opening 188 exposing the portion of the chip on film bonding pad 178 and the array test opening 189 exposing the portion of the array test pad 179.

As described above, the chip on film bonding opening 188 exposing the portion of the chip on film bonding pad 178 and the array test opening 189 exposing the portion of the array test pad 179 are separated. As such, the chip on film bonding part B1, to which the chip on film 500 is attached, and the array test part B2, contacted with the probe pin 1000, may be separated.

Accordingly, on the array test, the probe pin 1000 may not contact the chip on film bonding part B1, such that potential damage of the chip on film bonding pad 178 may be prevented. Also, the contact holes 168 and 169 may be covered by the protective layer 180, i.e., separating the chip on film bonding part B1 from the array test part B2, such that a contact defect of the probe pin caused by the contact hole having protrusions and depressions may be prevented.

In an organic light emitting diode (OLED) display according to an exemplary embodiment, the chip on film bonding part, i.e., connected to the chip on film, may be separated, i.e., via a protective layer, from the array test part, i.e., contacted with the probe pin. Therefore, the probe pin may not directly contact the chip on film bonding part, thereby preventing or substantially minimizing potential damage to the chip on film bonding pad. Also, the contact holes may be covered by the protective layer, separating the chip on film bonding part and the array test part, thereby preventing or substantially minimizing contact defect of the probe pin.

In contrast, when contacting a conventional array test pad with a probing pin, the array test pad may be directly damaged. A secondary damage, e.g., corrosion, may be generated from the damaged array test pad, and the damage may also influence signal lines positioned under the array test pad. In this case, after the chip on film bonding, reliability may be deteriorated due to the corrosion. Also, as the array test pad for the pin probing may include a contact hole, e.g., protrusions and depressions may be formed at the surface, a contact defect of the probe pin may be caused.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light emitting diode (OLED) display, comprising:
    a pixel part on a substrate, the pixel part being configured to display an image;
    a peripheral part at a peripheral area of the pixel part, the peripheral part including a chip on film connection part; and
    a chip on film connected to the chip on film connection part, the chip on film connection part including:
        a chip on film bonding part including a chip on film bonding pad, the chip on film being attached to the chip on film bonding part,
        an array test part separated from the chip on film bonding part, the array test part including an array test pad contacted with a probe pin, and
        a protective layer covering the chip on film bonding pad and the array test pad, the protective layer having openings exposing respective portions of the chip on film bonding pad and the array test pad, and the respective exposed portions being separated from each other by the protective layer.

2. The organic light emitting diode (OLED) display as claimed in claim 1, further comprising an interlayer insulating layer on the substrate, each of the chip on film bonding pad and the array test pad including portions penetrating through the gate insulating layer, and the protective layer covering the penetrating portions.

3. The organic light emitting diode (OLED) display as claimed in claim 1, wherein the openings exposing respective portions of the chip on film bonding pad and the array test pad are maintained open to expose flat portions of the film bonding pad and the array test pad.

4. An organic light emitting diode (OLED) display, comprising:
    a pixel part on a substrate, the pixel part displaying an image;
    a peripheral part at a peripheral area of the pixel part, the peripheral part including a chip on film connection part; and
    a chip on film connected to the chip on film connection part, the chip on film connection part including:
        a chip on film bonding part, the chip on film being attached to the chip on film bonding part, and
        an array test part separated from the chip on film bonding part, the array test part being contacted with a probe pin,
        wherein the chip on film bonding part includes:
            a gate insulating layer on the substrate,
            a chip on film bonding scan line on the gate insulating layer,
            an interlayer insulating layer covering the chip on film bonding scan line, and
            a chip on film bonding pad on the interlayer insulating layer and connected to the chip on film bonding scan line through a contact hole in the interlayer insulating layer.

5. The organic light emitting diode (OLED) display as claimed in claim 4, further comprising a protective layer covering the chip on film bonding pad and having a chip on film bonding opening exposing a portion of the chip on film bonding pad.

6. The organic light emitting diode (OLED) display as claimed in claim 5, wherein the array test part includes an array test pad on the interlayer insulating layer and connected to the chip on film bonding pad.

7. The organic light emitting diode (OLED) display as claimed in claim 6, wherein the protective layer includes an array test opening exposing a portion of the array test pad.

8. The organic light emitting diode (OLED) display as claimed in claim 7, further comprising a shorting bar connection line on the gate insulating layer and connected to the array test pad through a contact hole in the interlayer insulating layer.

9. The organic light emitting diode (OLED) display as claimed in claim 8, wherein the shorting bar connection line overlaps the array test pad.

10. The organic light emitting diode (OLED) display as claimed in claim 7, wherein the chip on film bonding part further comprises a shorting bar connection pad extending from the chip on film bonding pad.

11. The organic light emitting diode (OLED) display as claimed in claim 10, wherein the array test pad and the shorting bar connection pad branch into two from the chip on film bonding pad.

12. The organic light emitting diode (OLED) display as claimed in claim 11, further comprising a shorting bar connection line on the gate insulating layer and connected to the shorting bar connection pad through the contact hole in the interlayer insulating layer.

13. The organic light emitting diode (OLED) display as claimed in claim 12, wherein the shorting bar connection line overlaps the shorting bar connection pad.

* * * * *